US 6,717,362 B1

(12) United States Patent
Lee et al.

(10) Patent No.: US 6,717,362 B1
(45) Date of Patent: Apr. 6, 2004

(54) LIGHT EMITTING DIODE WITH GRADIENT INDEX LAYERING

(75) Inventors: Boon Kheng Lee, Kedah (MY); Kee Siang Goh, Penang (MY); Yee Loong Chin, Perak (MY); Chen Why Tan, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/371,142

(22) Filed: Feb. 20, 2003

(30) Foreign Application Priority Data

Nov. 14, 2002 (MY) ...................................... PI 20024260

(51) Int. Cl.$^7$ .................................................. H01J 1/62

(52) U.S. Cl. ...................... 313/512; 313/500; 313/312; 362/800

(58) Field of Search ................................. 313/512, 500, 313/312, 112; 362/800; 257/13, 97, 98

(56) References Cited

U.S. PATENT DOCUMENTS 5,777,433 A  *  7/1998  Lester et al. ................. 313/512
5,813,753 A  *  9/1998  Vriens et al. ................ 362/293

* cited by examiner

Primary Examiner—Ashok Patel

(57) ABSTRACT

A light emitting diode (100) is disclosed comprising a p-n junction diode for emitting light; and a transparent casing encapsulating the p-n junction diode. The transparent casing having an inner portion in contact with the p-n junction diode, wherein the refractive index of the transparent casing is higher at the inner portion than an outer portion thereof. In one embodiment the transparent casing comprises at least a first and a second transparent layer, with the first transparent layer encapsulating the p-n junction diode, and the second transparent layer encapsulating the first transparent layer, wherein the refractive index of the first transparent layer is higher than the refractive index of the second transparent layer. In an alternative embodiment the transparent casing comprises at least one transparent layer, wherein the refractive index of the transparent layer is higher at an inner portion than an outer portion thereof.

6 Claims, 4 Drawing Sheets

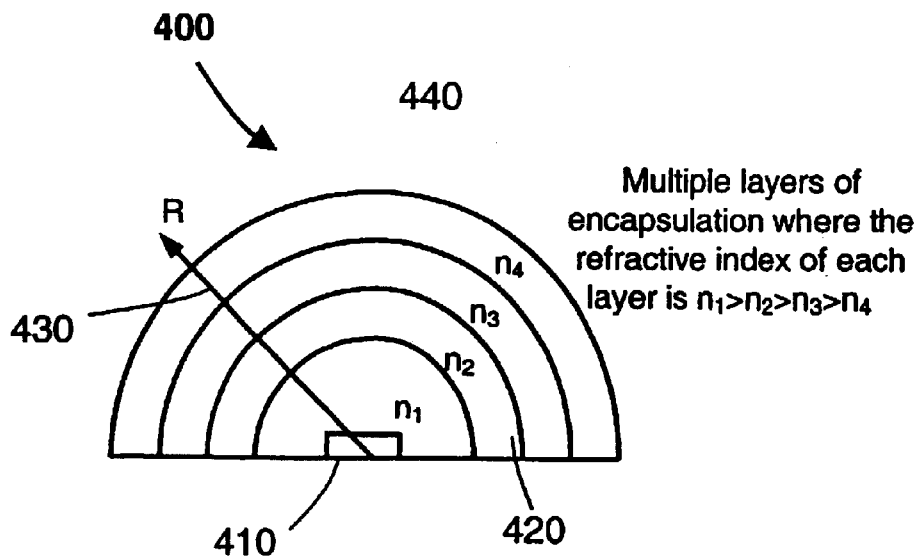
Fig. 4
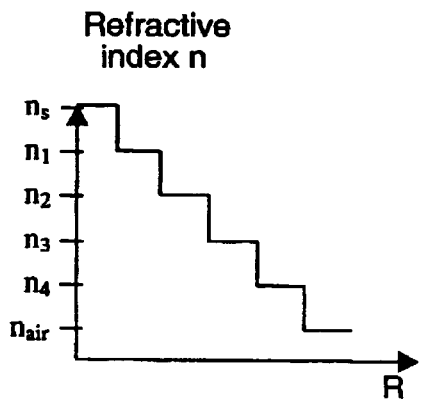
Fig. 5A
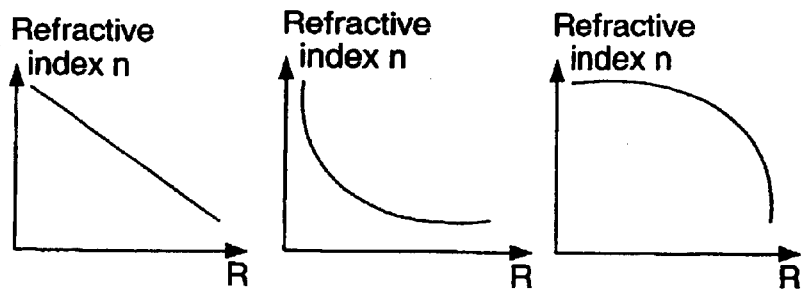
Fig. 5B  Fig. 5C  Fig. 5D

LIGHT EMITTING DIODE WITH GRADIENT INDEX LAYERING

TECHNICAL FIELD OF THE INVENTION

The present invention relates generally to Light Emitting Diodes (LEDs) and, in particular, to an LED with an improved light extraction capability.

BACKGROUND ART

A Light Emitting Diode (LED), as with other diodes, consists of a p-n junction that allows current to flow in one direction only. However, when a positive bias electrical voltage is applied to the LED, light is emitted in the form of photons.

LEDs are more durable than conventional incandescent bulbs, because LEDs do not have filaments that can bum out. However, the main advantage of LEDs, when compared with conventional incandescent bulbs, is their efficiency. In conventional incandescent bulbs the light producing process involves generating a lot of heat, which is wasted energy if the purpose is to generate light. In contrast thereto, LEDs generate relatively little heat, causing more of the energy supplied to the LED to be converted to light.

FIG. 1 illustrates the structure of a typical prior art LED 200. Energy is supplied to the p-n junction 210 through two terminal pins 230 and 231, causing the p-n junction to emit light. The p-n junction 210 of the LED 200 is encapsulated in a package 220, which is transparent to the light emitted from the p-n junction 210. For the light generated by the p-n junction 210 to be visible, the photons emitted by the p-n junction 210 have to travel through the package 220, and then through air to the eyes of an observer. In order to optimise the efficiency of the LED 200, it is desirable for as much as possible of the light generated by the p-n junction 210 to be emitted from the LED 200 to the observer. The invention seeks to address this desirable result.

U.S. Pat. No. 5,777,433 addresses this desirable result by providing a high refractive index package material for use in manufacture of the package 220. The high refractive index package material includes a host material and nanoparticles held in the host material. The host material has a refractive index lower than that of the p-n junction 210, and is transparent to the light emitted from the p-n junction 210. The nanoparticles are formed from a material having a refractive index higher that that of the host material. The resulting high refractive index package material has an effective refractive index that is higher than that of the host material without decreasing the transparency of the high refractive index package material. As will be shown herein, LEDs formed from the high refractive index package material disclosed in U.S. Pat. No. 5,777,433 have a limited success in achieving the desirable result.

SUMMARY OF THE INVENTION

According to an aspect of the invention, there is provided a light emitting diode comprising:

a p-n junction diode for emitting light; and a transparent casing encapsulating the p-n junction diode, the transparent casing having an inner portion in contact with the p-n junction diode, wherein the refractive index of the transparent casing is higher at the inner portion than an outer portion thereof.

In one embodiment, the transparent casing comprises at least a first and a second transparent layer, with the first transparent layer encapsulating the p-n junction diode, and the second transparent layer encapsulating the first transparent layer. The refractive index of the first transparent layer is higher than the refractive index of the second transparent layer.

In another embodiment, the transparent casing comprises at least one transparent layer, where the refractive index of the transparent layer is higher at an inner portion thereof than an outer portion.

The effect of the different refractive index arrangement of the layers is to reduce the Fresnel loss experienced by light emitted from the p-n junction diode.

BRIEF DESCRIPTION OF THE DRAWINGS

One or more embodiments of the present invention will now be described with reference to the drawings, in which:

FIG. 4 illustrates a general case where the LED is formed from a semiconductor material encapsulated by package; and FIGS. 5A to 5D show profiles of the refractive index of the package.

DETAILED DESCRIPTION INCLUDING BEST MODE

Figure 1:
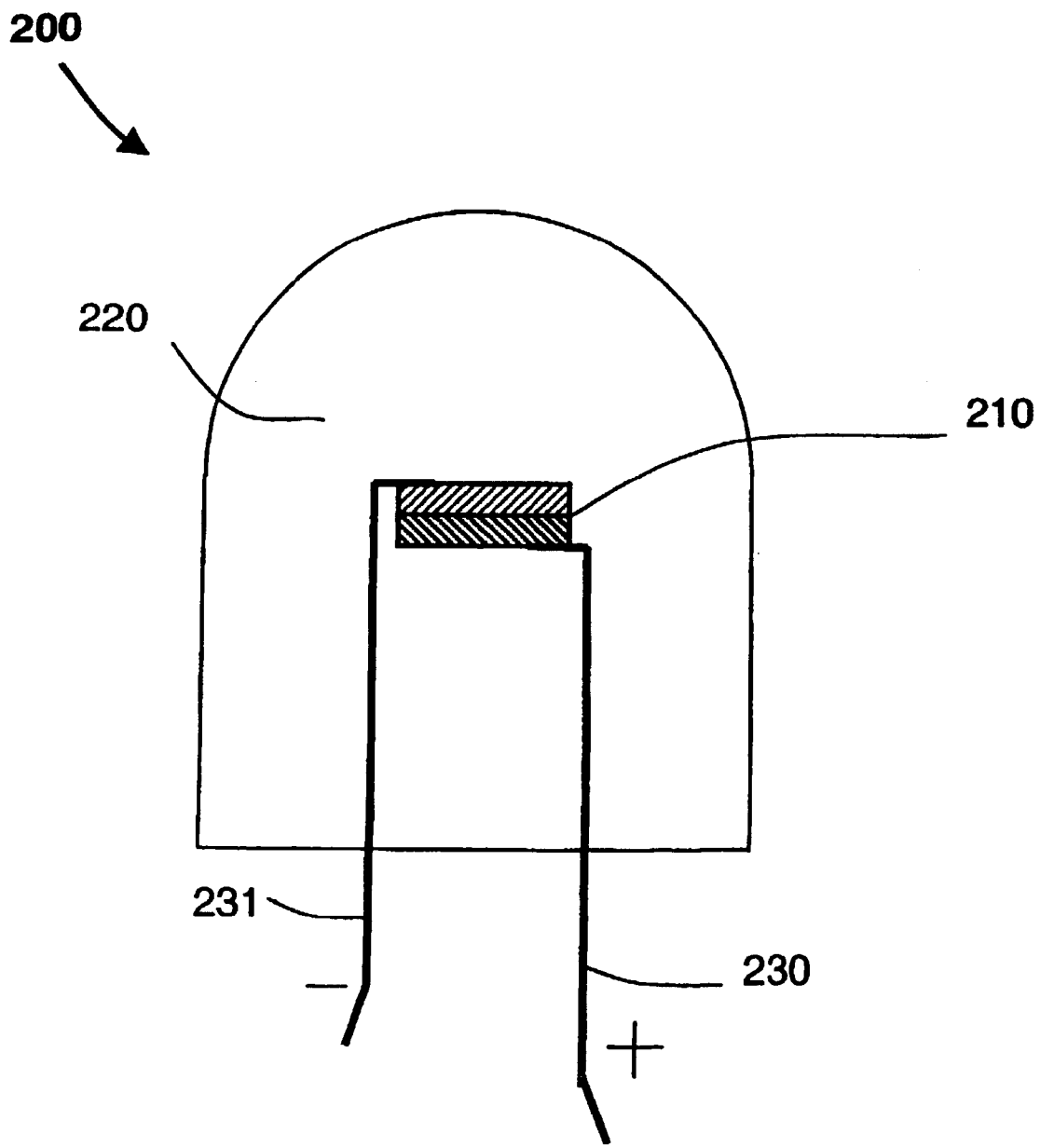
FIG. 1 illustrates the structure of a typical prior art LED.

Where reference is made in any one or more of the accompanying drawings to features, which have the same reference numerals, those features have for the purposes of this description the same function(s) or operation(s), unless the contrary intention appears.

As illustrated in FIG. 1, a prior art LED 200 typically includes semiconductor material forming a p-n junction 210, which is encapsulated by a package 220. When a positive bias electrical voltage is applied to the terminal pins 230 and 231 of the LED 200, light is emitted therefrom.

A first factor that contributes to the percentage of the total light generated by the p-n junction 210 that is emitted to air is the absorption of the light by the material of the package 220. This loss is dependent on the wavelength of the light emitted by the p-n junction 210 and the material of the package 220.

Figure 2:
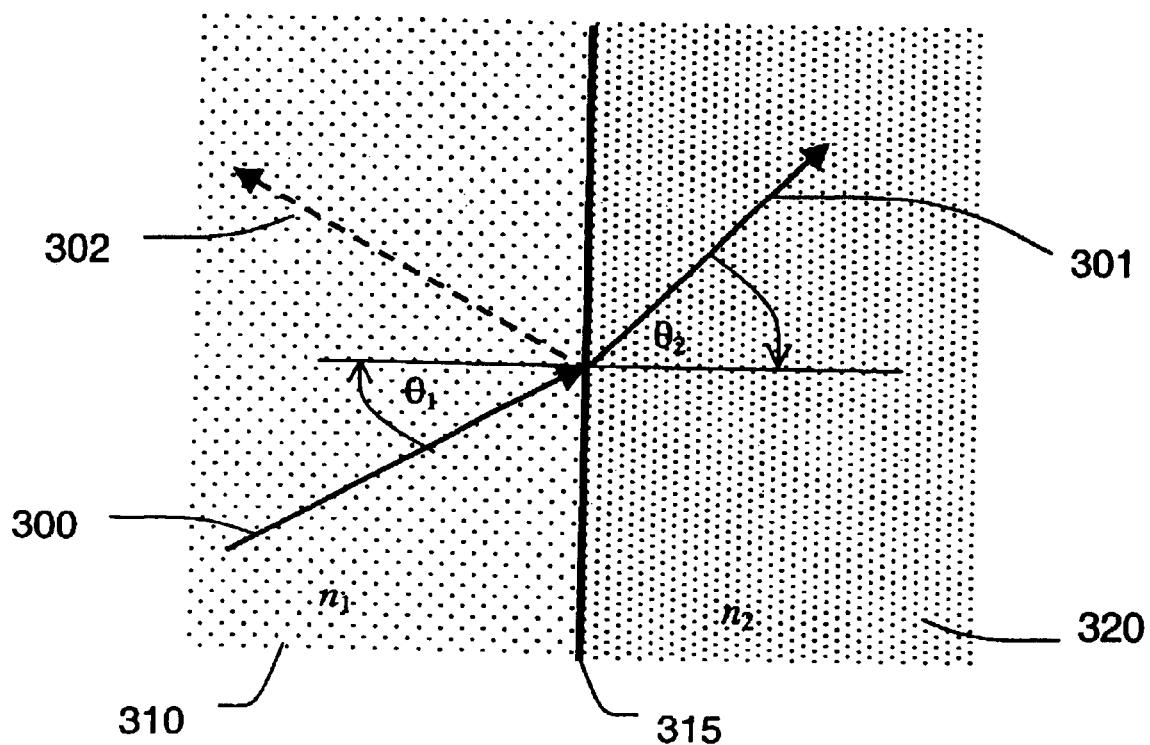
FIG. 2 illustrates a beam of light striking a smooth interface between two transparent media, with some of the light entering the second medium while the remainder of the light is reflected at the interface.

FIG. 2 illustrates a light beam 300 travelling through a first transparent medium 310. When the light beam 300 strikes a smooth interface 315 between the first transparent medium 310 and a second transparent medium 320, a first part 301 of the light beam 300 enters the second medium 320 while a second part 302 of the light beam 300 is reflected at the interface 315 back into the first medium 310. As light passes from the one medium to the other, the speed of the light changes. This change in speed is responsible for the bending of light, or refraction, and takes place at the interface between the two media.

Optical refractive index n of a medium is defined as the ratio of the speed of light in a vacuum, which is 3.00 ×10$^8$ m/s, to the speed of light in the medium. The extend of bending at the interface can be calculated using Snell's law, which is:

$$n_1 \sin \theta_1 = n_2 \sin \theta_2 \qquad (1)$$

where $n_1$ and $n_2$ are the respective optical refractive indexes of the media, and $\theta_1$ and $\theta_2$ are the respective angles that the light makes with the normal to the interface between the media. Hence, given that the respective optical refractive indexes of the media 310 and 320 illustrated in FIG. 2 are $n_1$ and $n_2$, the respective angles with the normal to the interface 315 are then $\theta_1$ and $\theta_2$.

From Snell's law it can be shown that when light crosses an interface into a medium with a higher refractive index, the light bends towards the normal. Similarly, when light travels across an interface from a medium with a higher refractive index to a medium with a lower refractive index, light bends away from the normal, as is the case illustrated in FIG. 2. At some angle, known as the critical angle, light travelling from a medium with a higher refractive index to a medium with a lower refractive index will be refracted at an angle of 90°, in other words, refracted along the interface. The critical angle can be found from Snell's law by substituting an angle of 90° therein, providing:

$$\theta_{critical} = \sin^{-1}\left(\frac{n_2}{n_1}\right) \tag{2}$$

where $n_1$ is the optical refractive index of the medium the light is travelling from and $n_2$ is the optical refractive index the light is travelling to. The critical angle $\theta_{critical}$ is thus a function of the ratio of the refractive indexes $n_2$ and $n_1$.

If the light hits the interface at any angle larger than this critical angle $\theta_{critical}$, the light will not pass through to the second medium at all. Instead, the light will be reflected back into the first medium, a process known as total internal reflection. The loss of light due to this total internal reflection is known as the critical angle loss, and is another contributing factor to the percentage of the total light generated by the p-n junction of the LED that is emitted to air.

Referring again to FIG. 2, the light reflected at the interface 315 is often called the Fresnel reflection or Fresnel Loss. The is defined as:

$$nFr = \frac{4}{2 + \frac{n_2}{n_1} + \frac{n_1}{n_2}} \tag{3}$$

From Equation (3) it is clear that any difference in the respective optical refractive indexes $n_1$ and $n_2$ of the media would result in Fresnel Losses. Hence, Fresnel Loss is a third factor contributing to the reduction in the percentage of the total light generated by the p-n junction 210 of the LED 200 that is emitted to air.

Consider for example a red LED where the p-n junction 210 of the LED 200 is manufactured from the semiconductor material gallium-arsenide-phosphor (GaAsP). This semiconductor material has an optical refractive index of 3.4. In the case where the p-n junction 210 is not encapsulated by a package, the Fresnel Loss Efficiency Factor of light travelling from the semiconductor material directly to air, with a refractive index of about 1, may be calculated using Equation (3) as:

$$nFr = \frac{4}{2 + \frac{3.4}{1} + \frac{1}{3.4}} = 0.702 \tag{4}$$

Hence, 70.2% of the light will escape to air.

Now consider the prior art arrangement illustrated in FIG. 1 where the semiconductor material 210 is encapsulated in a package 220. The refractive index of a typical layer of clear epoxy resin is about 1.52. The Fresnel Loss Efficiency Factor of light travelling from the semiconductor material, through the epoxy resin to air may be calculated as:

$$nFr = \frac{4}{2 + \frac{3.4}{1.52} + \frac{1.52}{3.4}} \times \frac{4}{2 + \frac{1.52}{1} + \frac{1}{1.5}} \tag{5}$$
$$= 0.854 \times 0.957 = 0.817$$

or 81.7% efficiency.

In the case where the package 220 is manufactured from the high refractive index package material disclosed in US Patent No. 5,77,433, which has a refractive index of between 1.6 and 3.0, then the Fresnel Loss Efficiency Factor of light travelling from the semiconductor material, through the high refractive index package material to air may be calculated as (using a refractive index value of 2.0 for the high refractive index package material):

$$nFr = \frac{4}{2 + \frac{3.4}{2} + \frac{2}{3.4}} \times \frac{4}{2 + \frac{2}{1} + \frac{1}{2}} \tag{6}$$
$$= 0.933 \times 0.889 = 0.829$$

or 82.9% efficiency. Hence, this arrangement only provides a small increase in efficiency when compared with the arrangement with the package 220 manufactured from a clear epoxy resin.

Figure 3:
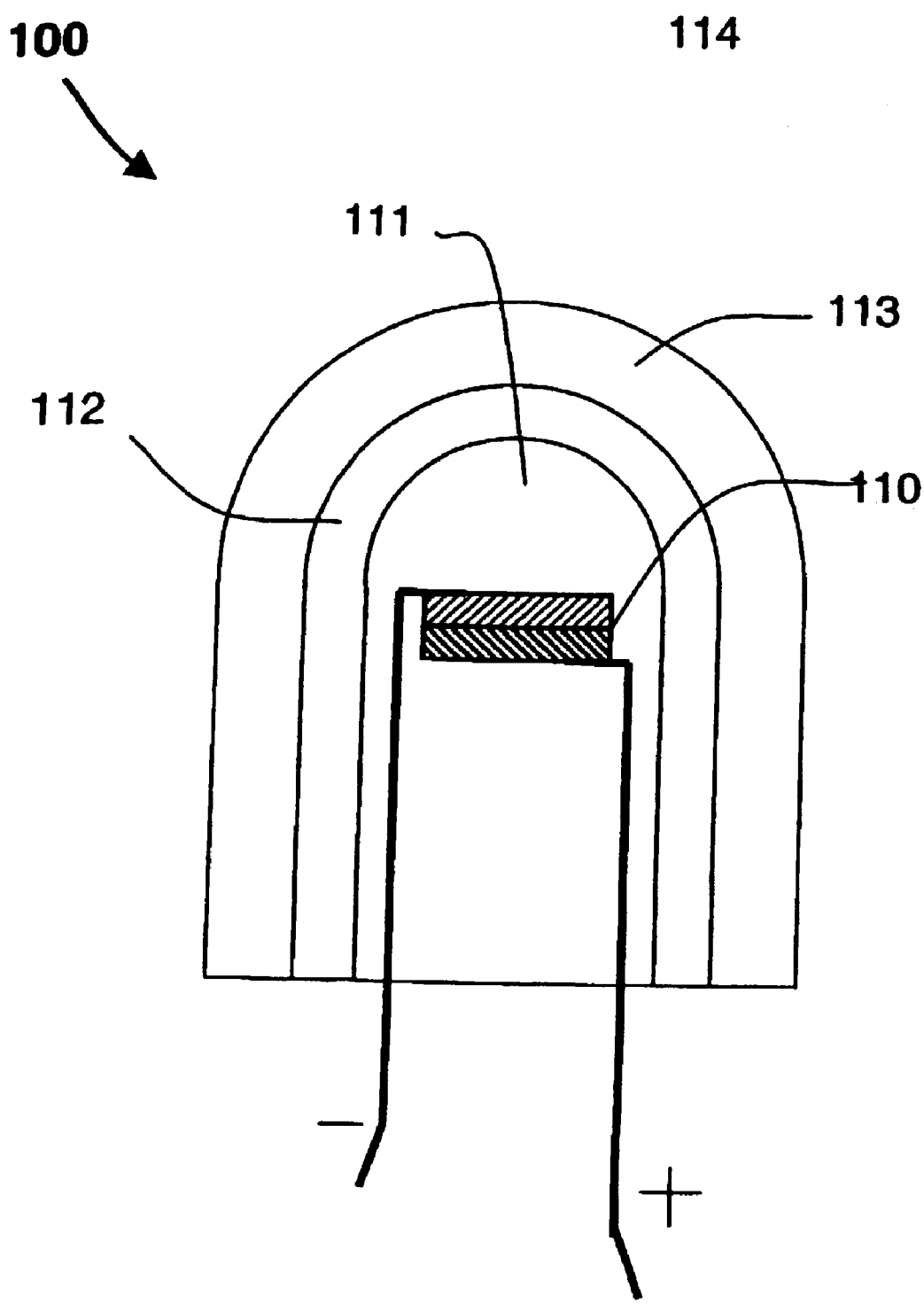
FIG. 3 illustrates a multi-layer LED according to a first embodiment of the invention.

FIG. 3 illustrates a multi-layer LED 100 according to a first implementation of the invention. The multi-layer LED 100 includes semiconductor material 110 forming a p-n junction diode. Examples of the semiconductor material 110 include GaAsP and GaN for providing LEDs emitting red and blue light respectively. The semiconductor material 110 is encapsulated by three layers 111, 112 and 113. The materials of the layers 111, 112 and 113 are chosen such that the refractive indexes of the layers progressively reduce, from close to that of the semiconductor material 110, to close to that of air 114. This results in small refractive index differences between the respective interfaces of the semiconductor material 110 and the first layer 111, the first layer 111 and the second layer 112, the second layer 112 and the third layer 113, and finally the third layer 113 and air 114. Even though the first implementation comprise three layers 111, 112 and 113, any number of layers may be used for this embodiment, as long as the refractive indexes of the layers have the above properties.

In an example the layers 111, 112 and 113 have refraction indexes of 3.3, 2.49, and 1.5 respectively. The Fresnel loss of the multi-layer LED 100 is as follows:

$$nFr = \frac{4}{2 + \frac{3.4}{3.3} + \frac{3.3}{3.4}} \times \frac{4}{2 + \frac{3.3}{2.49} + \frac{2.49}{3.3}} \times \frac{4}{2 + \frac{2.49}{1.5} + \frac{1.5}{2.49}} \times \frac{4}{2 + \frac{3.3}{1.5} + \frac{1.5}{3.3}} \times \frac{4}{2 + \frac{1.5}{1} + \frac{1}{1.5}} \tag{7}$$
$$= 0.999 \times 0.98 \times 0.938 \times 0.96 = 0.88$$

The percentage of the total light generated by the semiconductor material (p-n junction) 110 of the multi-layer LED 100 emitted to air 104 is thus 88%. Accordingly, with a proper selection of layer material for layers 111, 112 and 113, the multi-layer LED 100 has improved light extraction over the prior art LED illustrated in FIG. 1.

In the preferred implementation, layers 111, 112 and 113 have respective effective refractive indexes that are reducing from an inner portion of the LED 100 to the outside portion thereof, and have values from 3.3 to 1.3. However, material commonly used for encapsulating the semiconductor material 110, such as epoxy, polycarbonate, acrylic and Cyclo Olefin polymer (COC), have refractive indexes in the range 1.4 to 1.55.

The respective materials having the desired effective refractive indexes for use to form each of layers 111, 112 and 113 are made by mixing nanoparticles of a high refractive index material with a relatively low refractive index host material, such as epoxy. The nanoparticles may be produced using a variety of transparent metal oxides, such as Titanium dioxide ($TiO_2$), Magnesium Oxide (MgO), Zirconia ($ZrO_2$), and Alumina ($Al_2O_3$), or combinations of metal oxides. Group II–VI materials that are relatively free from scattering may also be used, including Zinc Selenide (ZnSe), Zinc Sulphide (ZnS), and alloys made from Zn, Se, S, and Te (Tellurium).

In addition, host material like silica ($SiO_2$) doped with $GeO_2$ or $P_2O_5$ will produce a higher effective refractive index. On the other hand, when this host material is doped with boron and fluorine, the refractive index will decrease. The doping technique such as metal chemical vapour deposition (MCVD) and vapour-phase axial deposition (VAD) are known technologies in the art.

In order to minimise the critical angle loss, the geometry of the layers 111, 112 and 113 is formed such that the angles of the light travelling through each interface between the layers to air is below the critical angle $\theta_{critical}$ in at least the area on the interface where it is desirable for light to be emitted from.

FIG. 4 illustrates a general case where the LED 400 is formed from a semiconductor material 410 encapsulated by package 420. In a first embodiment, which corresponds with the implementation described above, when the refractive index is measured along line 430, which extends radially outwards from the semiconductor material 410, through the package 420, to air 440, the refractive index has the profile shown in FIG. 5A.

According to a second embodiment (not illustrated) of the invention, the semiconductor material 10 is encapsulated by a single layer. However, in contrast to the package 220 of the prior art LED described with reference to FIG. 1, the single layer has a varying refractive index. An inner portion of the epoxy layer, that being the portion in contact with the semiconductor material 10, has a higher refractive indexes than that of an outer portion. Preferably the inner portion has a refractive index close to that of the semiconductor material 10, while the outer portion has a refractive index close to that of air. According to this embodiment, when the refractive index is measured along line 430 (FIG. 4), the refractive index may have a profile such as that shown in FIGS. 5B to 5D, where FIG. 5B illustrates the ideal case.

The foregoing describes only some embodiments of the present invention, and modifications and/or changes can be made thereto without departing from the scope and spirit of the invention, the embodiments being illustrative and not restrictive. For example, any transparent material may be used for the layer(s), as long as the refractive indexes of the layer(s) are progressively reduced from an inner portion to the outside portion.

What is claimed is:

1. A light emitting diode comprising:

a p-n junction diode for emitting light; and a transparent casing encapsulating said p-n junction diode, said transparent casing having an inner portion in contact with said p-n junction diode, wherein the refractive index of said transparent casing is higher at said inner portion than an outer portion thereof.

2. A light emitting diode according to claim 1 wherein the refractive index of said inner portion is lower than the refractive index of said p-n junction diode.

3. A light emitting diode according to claim 1 wherein said transparent casing comprises at least a first and a second transparent layer, with said first transparent layer encapsulating said p-n junction diode, and said second transparent layer encapsulating said first transparent layer, wherein the refractive index of said first transparent layer is higher than the refractive index of said second transparent layer.

4. A light emitting diode according to claim 3, wherein said transparent casing further comprises at least a third transparent layer encapsulating said second transparent layer, said third transparent layer having a refractive index that is lower than the refractive index of said second transparent layer.

5. A light emitting diode according to claim 3 wherein said first and second transparent layers are formed from a mixture of a host material and nanoparticles, said nanoparticles have a refractive index that is higher than that of said host material and selected from a group comprising:

Titanium dioxide ($TiO_2$), Magnesium Oxide (MgO), Zirconia ($ZrO_2$), Alumina ($Al_2{}_{O3}$), Zinc Selenide (ZnSe), Zinc Sulphide (ZnS), alloys made from Zn, Se, S, and Te, (Tellurium).

6. A light emitting diode according to claim 1 wherein said transparent casing comprises at least one transparent layer, wherein the refractive index of the transparent layer is higher at an inner portion than an outer portion thereof.

* * * * *